(12) United States Patent
Kim

(10) Patent No.: US 7,566,962 B2
(45) Date of Patent: Jul. 28, 2009

(54) SEMICONDUCTOR PACKAGE STRUCTURE AND METHOD FOR MANUFACTURING THE SAME

(75) Inventor: Hyeongno Kim, Paju-si (KR)

(73) Assignee: Advanced Semiconductor Engineering Inc., Kaohsiung (TW)

( * ) Notice: Subject to any disclaimer, the term of this patent is extended or adjusted under 35 U.S.C. 154(b) by 318 days.

(21) Appl. No.: 11/645,026

(22) Filed: Dec. 26, 2006

(65) Prior Publication Data

US 2008/0150110 A1    Jun. 26, 2008

(51) Int. Cl.
H01L 23/02 (2006.01)
H01L 23/48 (2006.01)

(52) U.S. Cl. .............. 257/686; 257/777; 257/723; 257/784; 257/E23.169

(58) Field of Classification Search .......... 257/686, 257/777, 723, 784, E23.169
See application file for complete search history.

(56) References Cited

U.S. PATENT DOCUMENTS

| | | | |
|---|---|---|---|
| 7,193,306 B2 * | 3/2007 | Akram et al. ............... | 257/686 |
| 7,276,786 B2 * | 10/2007 | Cho et al. .................. | 257/686 |
| 7,429,786 B2 * | 9/2008 | Karnezos et al. ........... | 257/686 |
| 2003/0042587 A1 * | 3/2003 | Lee ........................... | 257/678 |
| 2003/0047798 A1 * | 3/2003 | Halahan .................... | 257/685 |
| 2004/0150102 A1 * | 8/2004 | Lee et al. ................... | 257/723 |
| 2004/0159954 A1 * | 8/2004 | Hetzel et al. ............... | 257/777 |
| 2006/0055017 A1 * | 3/2006 | Cho et al. .................. | 257/686 |

\* cited by examiner

*Primary Examiner*—Nitin Parekh
(74) *Attorney, Agent, or Firm*—Muncy, Geissler, Olds & Lowe, PLLC

(57) ABSTRACT

A semiconductor package structure and a method for manufacturing the same are disclosed. The semiconductor package structure includes a substrate, an interposer (such as a circuitry laminate), a metal layer formed on the interposer, a first chip and a second chip, wherein the interposer is disposed on the substrate and covers at least a portion of an opening of the substrate, thereby defining a space for receiving the first chip, and the second chip is disposed on the metal layer or the interposer. The metal layer is electrically connected to the substrate and grounded. The first chip is electrically connected to the substrate.

13 Claims, 3 Drawing Sheets

SEMICONDUCTOR PACKAGE STRUCTURE AND METHOD FOR MANUFACTURING THE SAME

FIELD OF THE INVENTION

The present invention relates generally to a semiconductor package structure and a method for manufacturing the same, and more particularly, to a semiconductor package structure having an EMI (Electromagnetic Interference) shielding efficacy and the method for manufacturing the semiconductor package structure.

BACKGROUND OF THE INVENTION

With ever-increasing demands for higher operating speed and lightweight miniaturization of electronic devices, the semiconductor package structure including multiple chips (i.e. a multi-chip package structure) has become more and more popular. In a multi-chip package structure, a processor, a memory device and a logic chip can be assembled in one single package structure for minimizing the limitation of system operational speed caused by long connection paths existing on a printed circuit board. Further, the multi-chip package structure can shorten the length of the connection between chips, thereby lowering the signal delay and accessing time.

However, especially for high-frequency elements, radio frequency generated between chips may result in serious EMI, thus affecting the performance of the chips. Hence, a specific design has to be added for reducing the EMI problem. A conventional skill directly adds a conductive element between to two chips to interrupt the EMI between those two chips. However, the conventional skill has to first complete the related structures about two chips and then encapsulate those two chips together, and thus those two chips are exposed to the ambient for quite a long time, thus increasing the probability of damaging the chips. Further, the conventional skill actually increases the size of the package structure fabricated, thus having a difficulty in meeting the requirement of miniaturization.

SUMMARY OF THE INVENTION

One aspect of the present invention is to provide a semiconductor package structure and a manufacturing method thereof for overcoming the EMI problem and meeting the requirement of miniaturization.

Another Aspect of the present invention is semiconductor package structure and a manufacturing method thereof for individually encapsulating the respective chips so as to lowering the probability of damaging the chips.

According to an embodiment of the present invention, a semiconductor package structure comprises a substrate, an interposer, first chip and second chip, wherein the first chip can be for example a chip of wire-bond type or flip-chip type, and the second chip cab for example a chip of wire-bond type. The substrate has a first surface, a second surface opposite to the first surface, and an opening penetrating through the first surface and the second surface, the first surface having a plurality of first electrical contacts and a plurality of second electrical contacts disposed thereon, wherein the second electrical contacts are father away from the opening than the first electrical contacts. The interposer is made of for example a circuitry laminate. The interposer has a third surface and a fourth surface opposite to the third surface, and a plurality of third electrical contacts and a plurality of fourth electrical contacts are disposed on the third surface of the interposer, wherein the interposer is stacked on the first surface of the substrate, and covers at least one portion of the opening and the third electrical contacts, thereby defining an accommodation space, and the third electrical contacts are electrically connected to the first electrical contacts. The metal layer is formed on the fourth surface of the interposer. The first chip is received in the accommodation space, and is electrically connected to the fourth electrical contacts. The second chip is disposed on the metal layer or on the fourth surface of the interposer, and is electrically connected to the second electrical contacts of the substrate. The semiconductor package structure further comprises an encapsulant material for filling the accommodation space and encapsulating the first chip; and/or for encapsulating a portion of the first surface of the substrate, the interposer, the second chip, and the related wires. Besides, when the first chip is a chip of flip-chip type, an under material can be applied to cover the electrical connections between the first chip and the substrate before the encapsulant material is applied.

According to the embodiment of the present invention, a method for manufacturing the semiconductor package structure comprises: providing a substrate having a first surface, a second surface opposite to the first surface, and an opening penetrating through the first surface and the second surface, the first surface having a plurality of first electrical contacts and a plurality of second electrical contacts disposed thereon, wherein the second electrical contacts are father away from the opening than the first electrical contacts; providing an interposer having a third surface and a fourth surface opposite to the third surface, the third surface having a plurality of third electrical contacts and a plurality of fourth electrical contacts disposed thereon; disposing the interposer on the first surface of the substrate to cover at least one portion of the opening and the third electrical contacts, thereby defining an accommodation space; electrically connecting the third electrical contacts to the first electrical contacts; forming a metal layer on the fourth surface of the interposer; disposing a first chip in the accommodation space; electrically connecting the first chip to the fourth electrical contacts; disposing a second chip on the metal layer or the fourth surface of the interposer; and electrically connecting the second chip to the second electrical contacts of the substrate.

The embodiment can use an encapsulant material to perform respective molding steps on the first chip or the second chip promptly after the step of disposing the first chip or the step of disposing the second chip is performed, i.e. the first chip and the second chip are encapsulated respectively by two individual molding steps. Further, the embodiment also can use an encapsulant material to perform one molding step on the first chip or the second chip simultaneously after the step of disposing the first chip and the step of disposing the second chip both are performed, i.e. the first chip and the second chip are encapsulated by one single molding steps. Further, when the first chip is a chip of flip-chip type, the embodiment can first perform an underfilling step for using an underfill material to cover the electrical connections between the first chip and the interposer.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

The semiconductor package structure of the present invention can be formed from the combination of a chip of wire-bond type disposed above an interposer and a chip of flip-chip type disposed below the interposer; or from the combination of a wire-bond chip disposed above an interposer and a wire-bond chip disposed below the interposer.

Figure 1A:
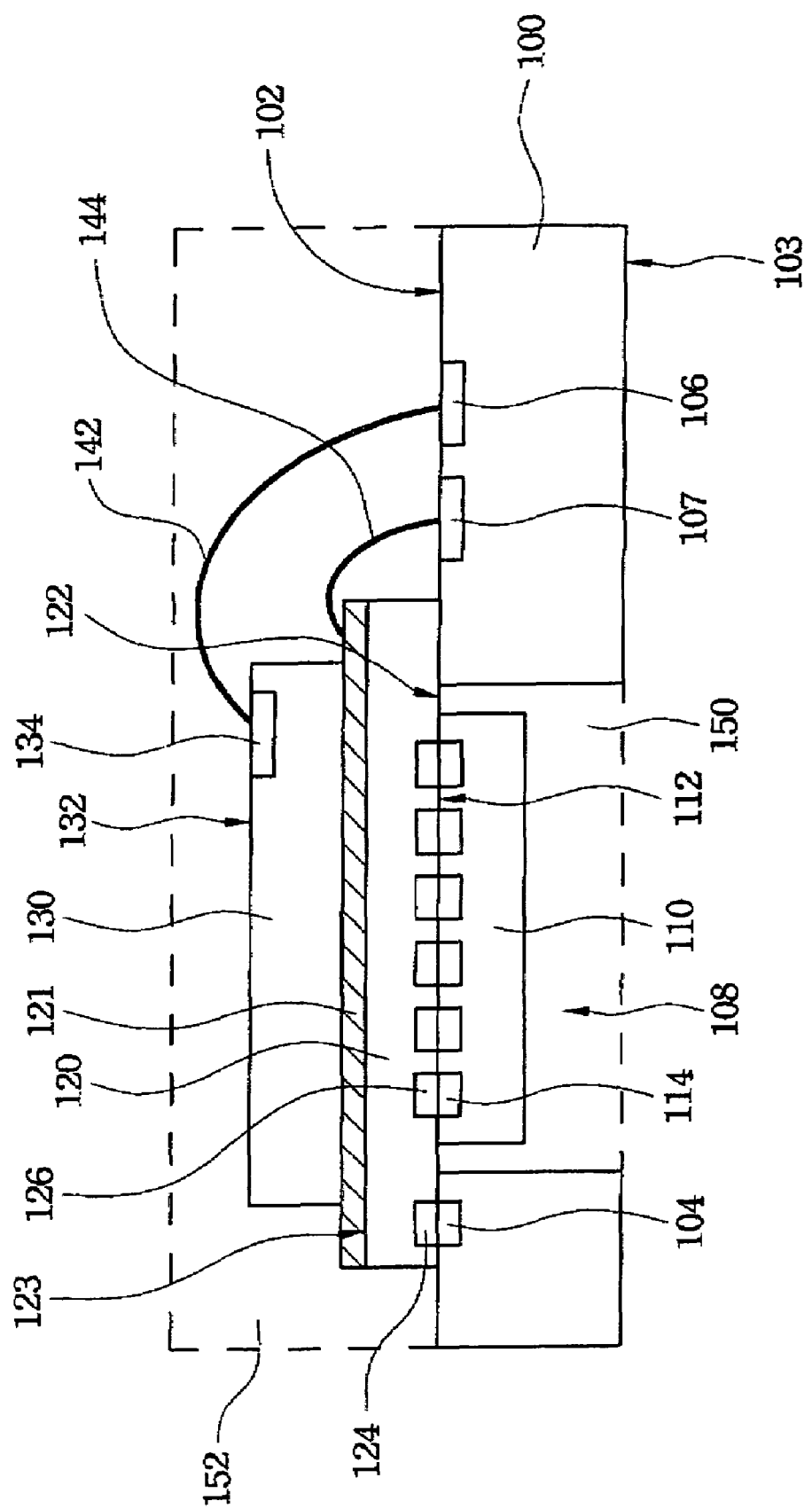
FIG. 1A is a schematic diagram showing a semiconductor package structure according to an embodiment of the present invention.

Referring to FIG. 1A, FIG. 1A is a schematic diagram showing a semiconductor package structure according to an embodiment of the present invention, wherein a first chip 110 is a chip of flip-chip type, and a second chip 130 is a chip of wire-bond type. At first, a substrate 100 is provided, wherein the substrate 100 has a surface 102, a surface 103 opposite to the surface 102, and an opening 108 penetrating the surface 102 and the surface 103. There are a plurality of electrical contacts 104, a plurality of electrical contacts 106 and an electrical contact 107 formed on the surface 102, wherein the electrical contacts 106 are father away from the opening 108 than the electrical contacts 104. Thereafter, an interposer 120 is disposed on the surface 102 of the substrate 100, and covers the entire or at least one portion of the opening 108 so as to define an accommodation space (not labeled) within the substrate 100. The interposer 120 has a surface 122 and a surface 123 opposite to the surface 122, wherein a plurality of electrical contacts 124 facing the substrate surface 102 are disposed on a periphery of the surface 122, and are electrically connected to the electrical contacts 104. A plurality of electrical contacts 126 are further disposed on the surface 122, wherein the electrical contacts 126 are exposed to the aforementioned accommodation space within the substrate 100, and are electrically connected to the electrical contacts 124. A metal layer 121 is disposed on the surface 123 of the interposer 120. In this embodiment, the surface 123 is located on the surface of the interposer 120 opposite to the surface 122. However, the metal layer 121 also can be disposed on any faces of the interposer 120 but the surface 122, and thus the present invention is not limited thereto. The metal layer 121 can be formed by metalizing one surface of the interposer 120. The interposer 120 can be made from for example a circuitry laminate. Thereafter, the metal layer 121 is electrically connected to the electrical contact 107 via a wire 144, and is grounded thereby for providing EMI shielding efficacy.

Thereafter, a first chip 110 is disposed on the surface 122, and is received in the aforementioned accommodation space within the substrate 100, wherein the first chip 110 can be attached to the surface 122 of the interposer 120 via for example a conductively adhesive material layer (not shown). The first chip 110 has a surface 112 facing towards the second chip 130, and a plurality of electrical contacts 114 are formed on the surface 112, and the electrical contacts 114 are electrically connected to the electrical contacts 126 of the interposer 120, thus forming a plurality of electrical connections, wherein the electrical connections can be such as metal bumps or anisotropic conductive films (ACFs). Meanwhile, after these electrical connections are formed, a molding step can be promptly performed for using an encapsulant material 150 to fill the aforementioned accommodation space within the substrate 100 for encapsulating the first chip 110, thereby completing the protection for the chip 110, thus reducing the time for exposing the first chip 110 to the external. Since the first chip is a chip of flip-chip type, this embodiment also can first perform an underfill step to cover the electrical connections between the first chip and the interposer with an underfill material, before the molding step is performed.

Then, a second chip 130 is disposed on the metal layer 121 of the interposer 120 via for example a conductively adhesive material layer (not shown), wherein the second chip 130 has a surface 132 on which a plurality of electrical contacts 134 are formed, and the electrical contacts 134 are electrically connected to the electrical contacts 106 of the substrate 100 via a plurality of wires 142. Thereafter, a molding step is performed for using a encapsulant material 152 to encapsulate a portion of the substrate surface 102, the interposer 120, the second chip 130, the wires 142 and 144, thereby completing the protection for the second chip 130.

Since the first chip 110 has been completely encapsulated while the second chip 130 is being installed, the first chip 110 can be prevented from being damaged by the subsequent process steps. Further, since the first chip 110 is received in the aforementioned accommodation space within the substrate 100, the size of the completed semiconductor package structure can be reduced, thus meeting the requirement of miniaturization. The first chip 110 is electrically connected to the substrate 100 via the interposer 120, and is not directly connected to the substrate 100, so that the EMI between the first chip 110 and the second chip 130 can be further interrupted.

Just as described above, after the interposer 120 is disposed on the substrate surface 102, this embodiment first performs the step of disposing the first chip 110, and applies the encapsulant material 150 to encapsulate the first chip 110; and thereafter performs the step of disposing the second chip 130, and applies the encapsulant material 152 to encapsulate the second chip 130. On the other hand, this embodiment also can first perform the step of disposing the second chip 130, and applies the encapsulant material 152 to encapsulate the second chip 130; and thereafter performs the step of disposing the first chip 110, and applies the encapsulant material 150 to encapsulate the first chip 110. Further, this embodiment also can first perform the steps of the of disposing the first chip 110 and the second chip 130, and then applies the encapsulant material 152 to encapsulate both the first chip 110 and the second chip 130.

Figure 1B:
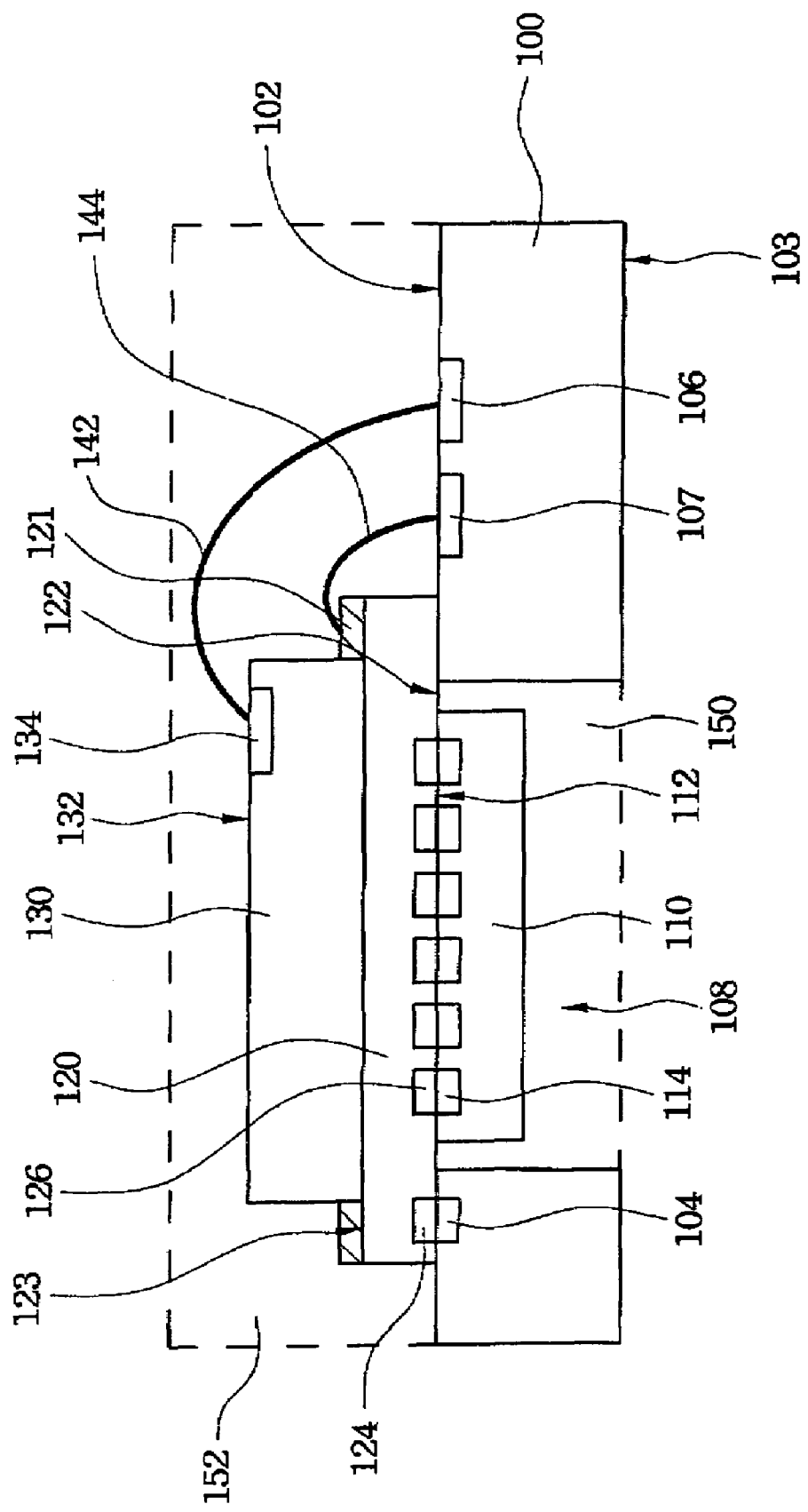
FIG. 1B is a schematic diagram showing a semiconductor package structure according to another embodiment of the present invention.

Referring to FIG. 1B, FIG. 1B is a schematic diagram showing a semiconductor package structure according to another embodiment of the present invention. The present embodiment is different from the embodiment shown in FIG. 1A in that: the metal layer 121 is disposed on the edges of the surface 123 of the interposer 120, and is not formed on a central area of the surface 123 of the interposer 120. In the present embodiment, the second chip 130 is disposed on the central area of the surface 123 of the interposer 120.

Figure 2:
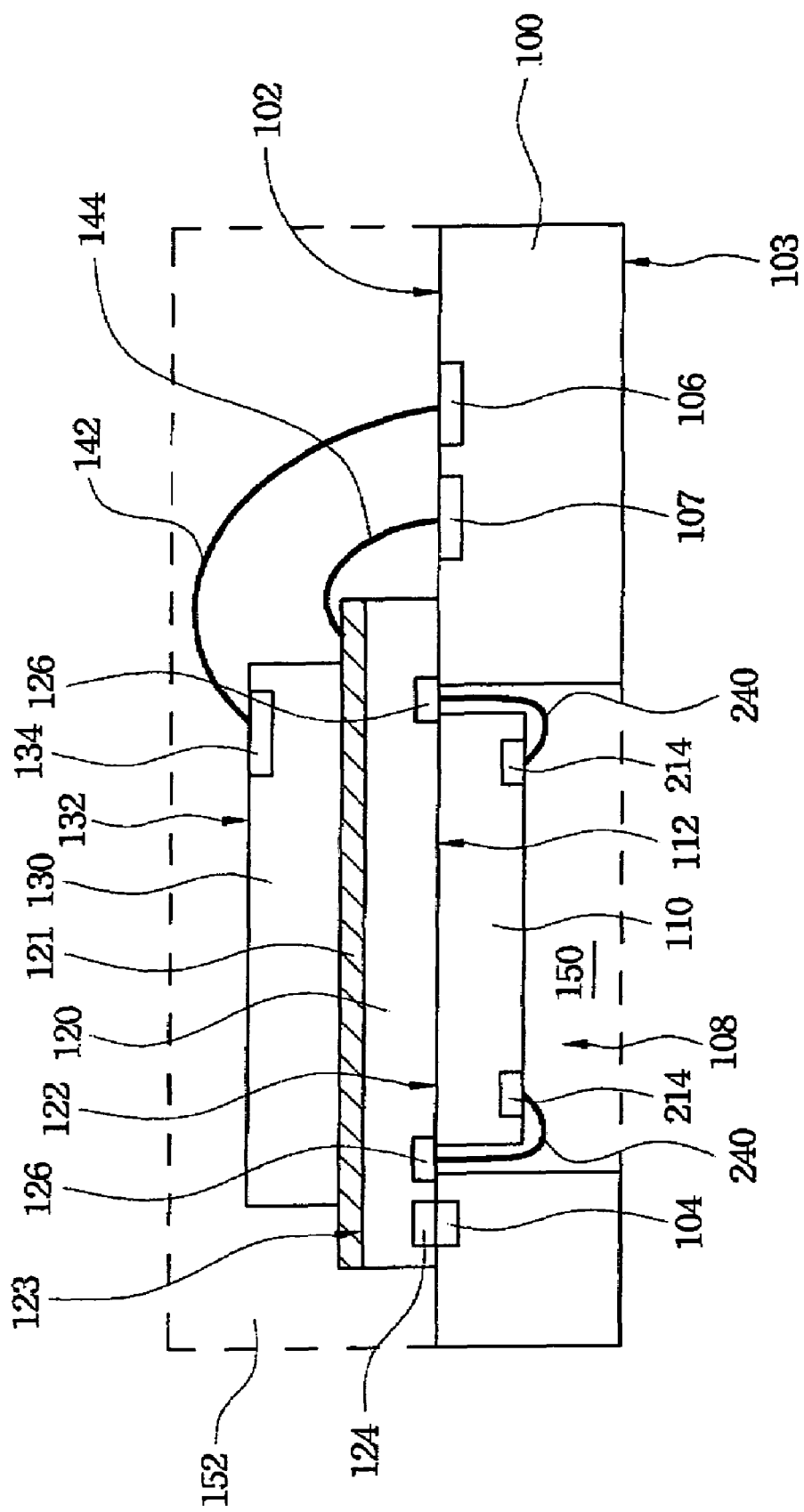
FIG. 2 is a schematic diagram showing a semiconductor package structure according to another embodiment of the present invention.

Referring to FIG. 2, FIG. 2 is a schematic diagram showing a semiconductor package structure according to another embodiment of the present invention, wherein the first chip 110 and the second chip 130 both are the chips of wire-bond type. Except that the first chip 110 is a chip of wire-bond type instead of flip-chip type, the semiconductor package structure and the manufacturing steps thereof in this embodiment are similar to those of the embodiment shown in FIG. 1. The first chip 110 is disposed on the surface 122 of the interposer 120, and is received in the aforementioned accommodation space within the substrate 100, wherein the first chip 210 can be attached to the surface 122 via for example a conductively adhesive material layer (not shown). The first chip 210 has a surface 212 facing the side of the substrate 100 opposite to the second chip 130, and a plurality of electrical contacts 214 are formed on the surface 212, and the electrical contacts 214 are electrically connected to the electrical contacts 126 of the interposer 120 via wire 240.

Hence, according to the aforementioned embodiments, the semiconductor package structure and the method for manufacturing the same can provide the EMI shielding efficacy, and meet the requirement of miniaturization; and can lower the probability of damaging the chips in process.

As is understood by a person skilled in the art, the foregoing preferred embodiments of the present invention are illustrated of the present invention rather than limiting of the present invention. It is intended to cover various modifications and similar arrangements included within the spirit and scope of the appended claims. Therefore, the scope of which should be accorded the broadest interpretation so as to encompass all such modifications and similar structure.

What is claimed is:

1. A semiconductor package structure, comprising:
    a substrate having a first surface, a second surface opposite to the first surface, and an opening penetrating through the first surface and the second surface, the first surface having a plurality of first electrical contacts and a plurality of second electrical contacts disposed thereon, wherein the second electrical contacts are father away from the opening than the first electrical contacts;
    an interposer having a third surface and a fourth surface opposite to the third surface, the third surface having a plurality of third electrical contacts and a plurality of fourth electrical contacts disposed thereon, wherein the interposer is stacked on the first surface of the substrate, and covers at least one portion of the opening and the third electrical contacts, thereby defining an accommodation space, and the third electrical contacts are electrically connected to the first electrical contacts;
    a metal layer formed on the fourth surface of the interposer,
    a first chip received in the accommodation space and electrically connected to the fourth electrical contacts; and
    a second chip disposed on the metal layer and electrically connected to the second electrical contacts of the substrate.

2. The semiconductor package structure according to claim 1, further comprising:
    a plurality of electrically connecting elements used for electrically connecting the first chip to the fourth electrical contacts of the interposer, wherein the electrically connecting elements are selected from the group consisting of wires, metal bumps and anisotropic conductive films (ACFs).

3. The semiconductor package structure according to claim 1, further comprising:
    a conductively adhesive material layer disposed between the first chip and the third surface of the interposer.

4. The semiconductor package structure according to claim 1, further comprising:
    a conductively adhesive material layer disposed between the second chip and the metal layer.

5. The semiconductor package structure according to claim 1, further comprising:
    an encapsulant material used for filling the accommodation space and encapsulating the first chip.

6. The semiconductor package structure according to claim 1, wherein the substrate has a plurality of fifth electrical contacts formed thereon, and the metal layer is electrically connected to the fifth electrical contacts.

7. The semiconductor package structure according to claim 1, further comprising:
    an encapsulant material used for encapsulating a portion of the first surface of the substrate surface, the interposer and the second chip.

8. The semiconductor package structure according to claim 7, wherein the encapsulant material further encapsulates the first chip.

9. The semiconductor package structure according to claim 1, wherein the second chip is a chip of wire-bond type.

10. The semiconductor package structure according to claim 1, wherein the first chip is a chip of flip-chip type.

11. The semiconductor package structure according to claim 1, further comprising:
    an underfill material used for covering the electrical connections between the first chip and the interposer.

12. The semiconductor package structure according to claim 1, wherein the first chip is a chip of wire-bond type.

13. The semiconductor package structure according to claim 1, wherein the interposer is made of a circuitry laminate.

* * * * *